United States Patent [19]

Sato et al.

[11] Patent Number: 5,162,971

[45] Date of Patent: Nov. 10, 1992

[54] HIGH-DENSITY CIRCUIT MODULE AND PROCESS FOR PRODUCING SAME

[75] Inventors: Teruhiro Sato; Tomio Wada; Mikio Kobayashi, all of Yokohama, Japan

[73] Assignee: Matsushita Electric Industrial Co., Ltd., Osaka, Japan

[21] Appl. No.: 495,425

[22] Filed: Mar. 19, 1990

[30] Foreign Application Priority Data

Mar. 23, 1989 [JP] Japan .................. 1-073644
Nov. 15, 1989 [JP] Japan .................. 1-298636

[51] Int. Cl.⁵ .............................. H05K 9/00
[52] U.S. Cl. .................. 361/424; 174/35 R; 361/399
[58] Field of Search ............ 174/35 R, 35 MS, 51, 174/52.4; 361/390, 391, 392, 394, 395, 396, 397, 399, 419, 424; 439/92, 94, 95, 96, 101, 108, 109

[56] References Cited

U.S. PATENT DOCUMENTS

| | | | |
|---|---|---|---|
| 4,404,617 | 9/1983 | Ohyama et al. ........... | 361/424 |
| 4,628,412 | 12/1986 | Nigorikawa ............... | 361/424 |
| 4,649,461 | 3/1987 | Matsuta ...................... | 361/415 |
| 4,725,920 | 2/1988 | Ijichi et al. ................ | 361/388 |
| 4,912,604 | 3/1990 | Väisänen ................... | 361/424 |

FOREIGN PATENT DOCUMENTS

| | | | |
|---|---|---|---|
| 2909524 | 9/1979 | Fed. Rep. of Germany ...... | 361/424 |
| 3604730 | 8/1986 | Fed. Rep. of Germany ...... | 361/424 |
| 0024496 | 1/1989 | Japan ........................ | 174/35 R |
| 0024497 | 1/1989 | Japan ........................ | 174/35 R |
| 0073693 | 3/1990 | Japan ........................ | 174/35 R |
| 0250400 | 10/1990 | Japan ........................ | 174/35 R |
| 2165399 | 4/1986 | United Kingdom .............. | 361/419 |

*Primary Examiner*—Leo P. Picard
*Assistant Examiner*—D. Sparks
*Attorney, Agent, or Firm*—Stevens, Davis, Miller & Mosher

[57] ABSTRACT

A high-density circuit module has a box shaped shielding case made from a plate blank which is bent to provide the shield case. A printed wiring board is placed on the bottom surface portion of the shielding case, and a plurality of electronic components are soldered to conductor lands of the printed wiring board. A plurality of externally connected leads are soldered to connection lands of the printed wiring board. A process for producing the high-density circuit module includes the steps of placing the printed wiring board on the blank, then soldering the electronic components and leads to the printed wiring board and then bending the blank to provide the shielding case. The plurality of externally connected leads are formed from a plurality of leads which are originally integrally connected to the bottom surface portion of the shielding case, by separating the plurality of leads form the bottom surface portion of the shielding case. A high-density circuit module having a small number of parts and a simple structure is easily manufactured.

9 Claims, 10 Drawing Sheets

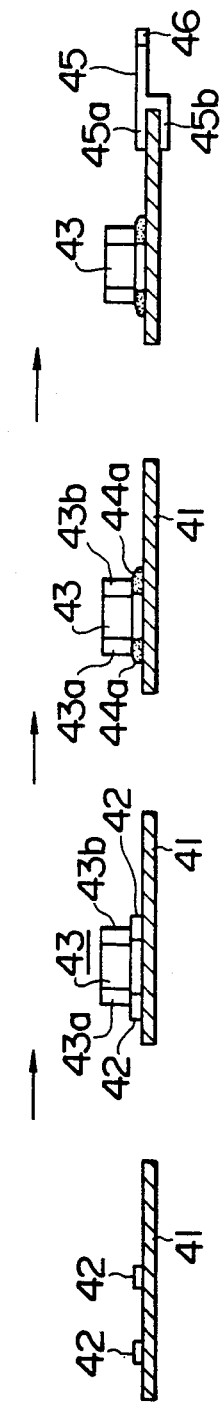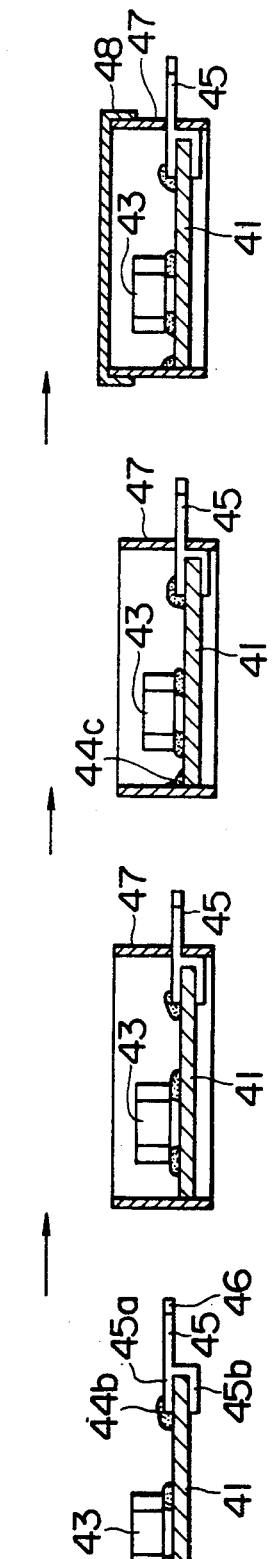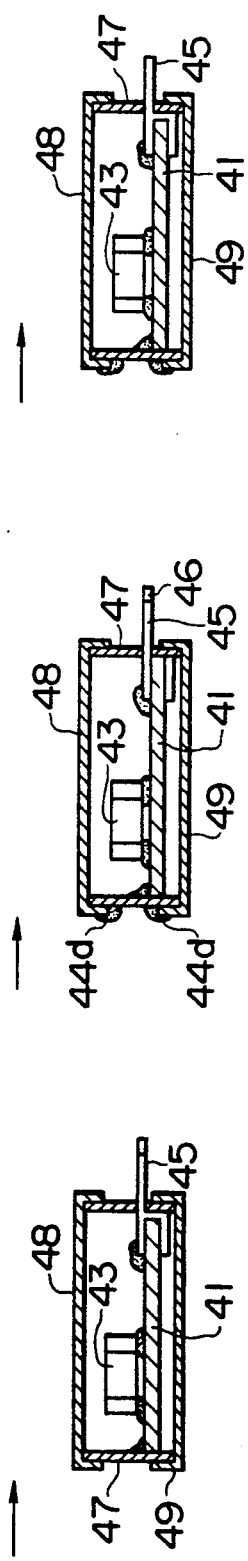

HIGH-DENSITY CIRCUIT MODULE AND PROCESS FOR PRODUCING SAME

BACKGROUND OF THE INVENTION

1. Field of the Invention

The present invention relates to a high-density circuit module used in various electronic apparatuses, e.g., a high-density circuit module providing a front end of a broadcasting radio receiver and to a process for producing the high-density circuit module.

Such a front end of a broadcasting radio receiver comprises a high-frequency amplifying circuit, tuning circuit, locally oscillating circuit, mixing circuit, intermediate-frequency amplifying circuit, etc. In particular, the front end of the broadcasting radio receiver is made with a small high-density circuit module in which circuit components, e.g., a chip resistor, chip capacitor, semiconductor device and coil are soldered to a printed wiring board covered with a shielding plate. The present invention is directed to the above-mentioned high-density circuit module and the process therefor.

2. Description of the Prior Art

FIGS. 1A, to 1K illustrate a process of producing a conventional high-density circuit module. In FIG. 1A, 41 denotes a printed wiring board. The top surface of the printed wiring board 41 has a topside conductor pattern (not shown) formed thereon and electrically connecting various electronic components mounted on the printed wiring board. The underside surface of the printed wiring board 41 has a shielding conductor pattern (not shown) formed thereon. 42 denotes a creamy solder applied by printing, dispensation etc. to the top surface of the printed wiring board 41. As shown in FIG. 1B, 43 denotes a chip resistor 43 the opposite ends of which have connection terminals 43a and 43b. Resistor 43 is mounted on the printed wiring board 41 so that the connection terminals 43a and 43b are in contact with the creamy solder 42 provided on the printed wiring board 41. As shown in FIG. 1C, by reflowing the solder 42 applied to the printed wiring board 41 on which the chip resistor 43 is mounted, the conductor pattern of the printed wiring board 41 is connected by means of soldering 44a to the connection terminals 43a and 43b of the chip resistor 43. As shown in FIG. 1D, 46 denotes a tie bar in the form of a thin metal strip wherein a plurality of external leads 45a and a plurality of retaining pieces 45b are integrally formed to the tie bar 46. As shown in FIG. 1C, one side of the printed wiring board 41 is inserted between the plurality of external leads 45a and the plurality of retaining pieces 45b. As shown in FIG. 1E, then the front end of each of the external leads 45a is connected by means of soldering 44b to the topside conductor pattern of the printed wiring board 41. As shown in FIG. 1F, then a framework 47 made of a metal plate covers the printed wiring board 41. As shown in FIG. 1G, then the framework 47 is fastened by soldering 44c to the printed wiring board 41. As shown in FIG. 1H, then an upper shielding case 48 is mounted an the top edge of the framework 47. As shown in FIG. 1I, then a lower shielding case 49 is mounted to the bottom surface of the framework 47. As shown in FIG. 1J, then the upper and lower shielding cases 48 and 49 are fastened by solderings 44d to the framework 47. As shown in FIG. 1K, the tie bar 46 is finally cut off the external leads 45 so that the prior-art high-density circuit module is completed. By soldering the external leads 45a of the complete high-density circuit module to a main printed wiring board (not shown) an electric circuit of the high-density circuit module is electrically connected to an electric circuit of the main printed wiring board by means of the external leads 45a. FIGS. 1A to 1K illustrate a single chip resistor 43 of a plurality of circuit components mounted on the printed wiring board 41. However, a number of circuit components are actually mounted on the printed wiring board 41.

Thus, the prior-art process of producing the high-density circuit module comprises the eleven steps of FIGS. 1A to 1K. This prior-art process requires a large number of parts and a large number of steps, so that a material cost and processing cost are increased.

SUMMARY OF THE INVENTION

In view of the prior-art drawbacks as described above, the present invention provides a high-density circuit module and process for producing same overcoming these prior-art drawbacks.

A primary object of the present invention is to provide a high-density circuit module having a small number of parts and a simple structure.

Another object of the present invention is to provide a high-density circuit module which facilitates a design of a conductor pattern even when the density of circuit components mounted on a printed wiring board contained within a shielding case is high and which maintains its performance. When the density of circuit components mounted o the printed wiring board is increased, a spacing for fretting the conductor pattern on the printed wiring board is decreased so that a leading of the high-density circuit module to the outside is difficult. In addition, when a grounding path is made narrow, a grounding of the high-density circuit module is insufficient, the performance of the high-density circuit module is deteriorated and the characteristic thereof is made unstable. The present invention provides a high-density circuit module which provides an external leading point and a grounding point optionally positioned on the printed wiring board and which facilitates a design of the conductor pattern, prevents a performance deterioration of the high-density circuit module and stabilizes a characteristic thereof. The present invention also provides a process for producing this high-density circuit module.

A further object of the present invention is to provide a process with a small step number for easily producing a high-density circuit module. The present invention employs a shielding plate blank in the form of an unfolded shape of a shielding case which blank is readily constructed into the shielding case by means of bending the blank. In addition, the printed wiring board and shielding case are soldered to each other and concurrently, electronic components are soldered to the printed wiring board, so that the number of steps of the process is reduced, thereby allowing the production of the high-density circuit module to be facilitated.

BRIEF DESCRIPTION OF THE DRAWINGS

FIGS. 1A to 1K illustrate a conventional process for producing a high-density circuit module;

DESCRIPTION OF THE PREFERRED EMBODIMENTS

Figure 2A:
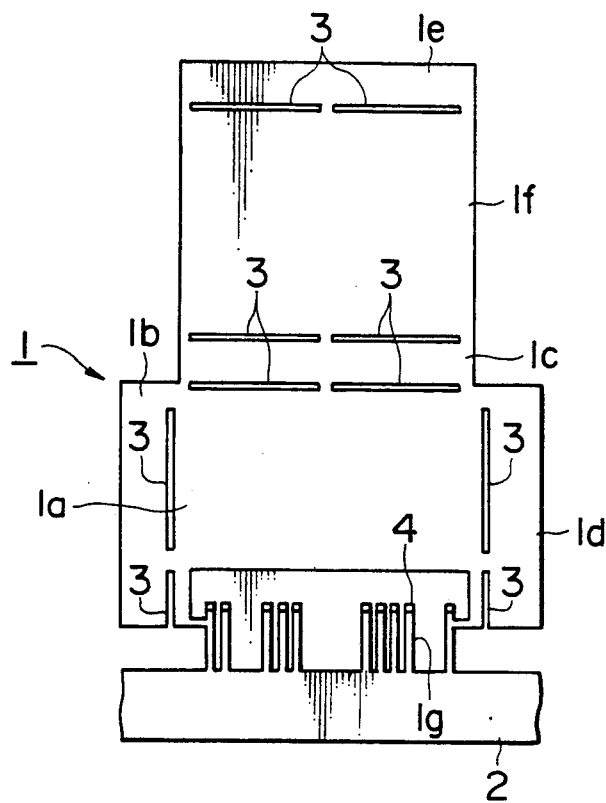
FIGS. 2A to 2E illustrate a process for producing a high-density circuit module according to a first embodiment of the present invention.
Figure 2B:
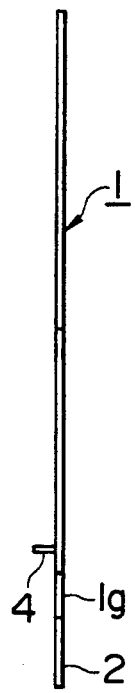
Figure 2C:
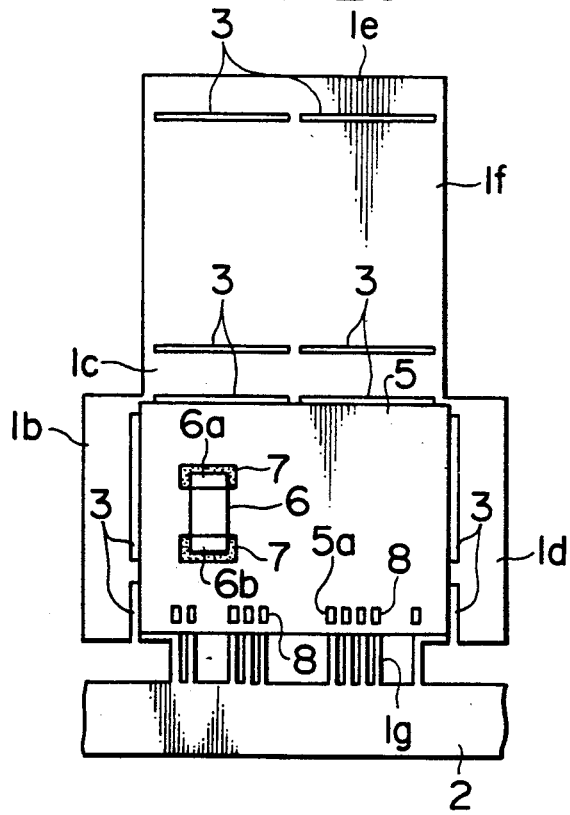
Figure 2D:
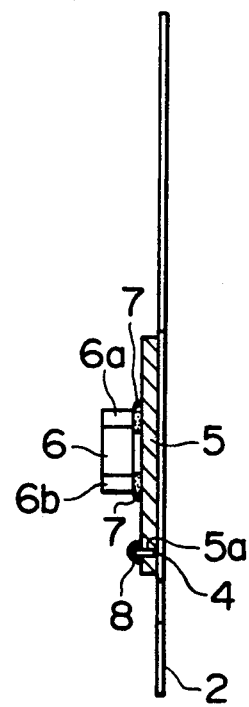
Figure 2E:
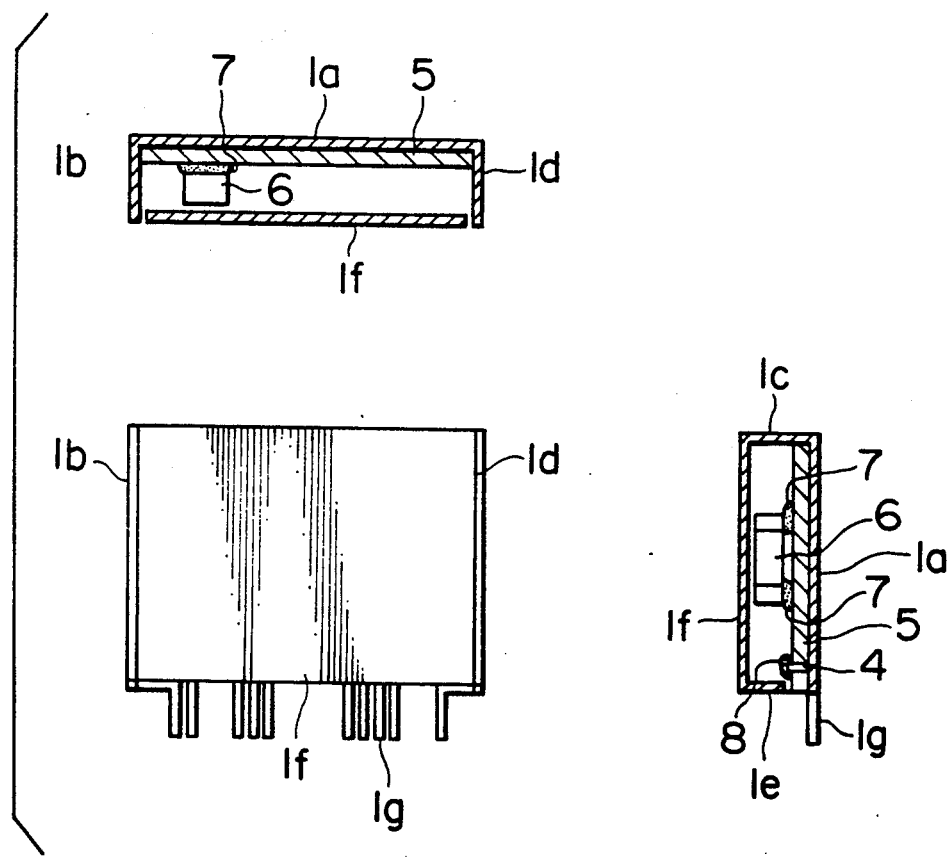

The preferred embodiments of the present invention will be described in detail with reference to the drawings hereinafter. FIGS. 2A to 2E illustrate a process for producing a high-density circuit module according to a first embodiment of the present invention. In FIGS. 2A and 2B, 1 denotes a shielding plate blank which is provided by eliminating unnecessary parts of a thin metal strip by means of cutting, pressing, etching etc. and bending predetermined portions of the processed metal strip. The shielding plate blank 1 comprises a bottom surface portion 1a to constitute the bottom surface of a box shaped shielding case, side surface portions 1b, 1c, 1d and 1e to constitute the respective side surfaces of the shielding case, a top surface portion 1f to constitute the top surface of the shielding case, and a plurality of leads 1g adjoining a tie bar 2. Each of the interface portions between the bottom portion 1a and respective side portions 1b, 1c and 1d and between the top portion 1f and respective side portions 1c and 1e has a slit 3 formed therein. The shielding plate blank 1 is made with a thin plate of a metal, e.g., steel or a copper alloy, or made with a plated thin metal plate derived therefrom. The tie bar 2 extends in the right and left direction and is connected to a number of the same shielding plate blanks attached thereto as the shielding plate blank 1 shown in FIG. 2A. FIG. 2B is a side view of an assembly of the shielding plate blank 1 and tie bar 2 of FIG. 2A. A free end of each of the external leads 1g is bent substantially a right angle to provide a raised end 4. FIGS. 2C and 2D illustrate a state in which a printed wiring board 5 is placed on the bottom surface portion 1a of the shielding plate blank 1. The top surface of the printed wiring board 5 has a conductor pattern (not shown) formed thereon for connecting circuit components to each other. The bottom surface of the printed wiring board 5 has an underside shielding conductor pattern (not shown) formed thereon. The printed wiring plates are provided by forming the conductor pattern on a copper foil laminated on a substrate of the printed wiring board 5 by means of etching or the like and forming holes by means of punching and drilling at predetermined places thereof. The substrate of the printed wiring board 5 includes, e.g., an organic substrate such as a paper and phenol resin substrate or a glass epox resin substrate, an inorganic substrate such as a ceramic substrate and a composite substrate with a core made of a metal. Each of the raised ends 4 of the external leads 1g of the shielding plate blank 1 is inserted into a small hole 5a defined in the printed wiring plate 5. A creamy solder is applied by dispensation, printing or the like to required places of the top surface of the printed wiring board 5. A circuit component 6 is mounted on the creamy solder. FIGS. 2C to 2E illustrate only one circuit element 6 of a plurality of circuit components mounted on the top surface of the printed wiring board 5 and eliminate illustrations of the other circuit elements. In the state in which the creamy solder is applied to the required places of the top surface of the printed wiring board 5, when the creamy solder is molten by heating, the connection terminals 6a and 6b of the circuit element 6 are connected to the topside conductor pattern of the printed wiring board 5, and each of the raised ends 4 of the external leads 1g is soldered to a connection land of the topside conductor pattern of the printed wiring board 5. In FIGS. 2C to 2E, 7 denotes a soldering for bonding the connection terminals 6a and 6b of the circuit element 6 to the topside conductor pattern of the printed wiring board 5, and 8 denotes a soldering for bonding the raised end 4 of the external lead 1g of the shielding plate blank 1 to the conductor pattern of the printed wiring board 5. The interface portions of the shielding plate blank 1 forming the slits 3 are substantially bent at right angle to provide a box-shaped shielding case, in which the printed wiring board 5 is disposed. As shown in FIG. 2E, the tie bar 2 is finally separated from the external leads 1g to complete the high-density circuit module. Then, only opposite outermost external leads 1g of the ten external leads 1g of FIGS. 2C and 2E are connected to the bottom surface portion 1a of the shielding plate blank 1 and serve as grounding lead terminals of the high-density circuit module.

Thus, in accordance with the first embodiment of the present invention, the printed wiring board 5 is mounted on the shielding plate blank 1 comprising the bottom surface portion 1a, side surface portions 1b, 1c, 1d and 1c, top surface portion 1f and the external leads 1g being attached to the shielding plate blank 1, then circuit components are soldered to the topside conductor pattern of the printed wiring board 5. Then the side portions 1b, 1c, 1d and 1e and top portion 1f are bent at the respective joints, and then the tie bar 2 is separated from the external leads 1g, whereby the high-density circuit module providing with the shielding case and external leads is obtained.

The first embodiment employs a reflow soldering process. Alternatively, another soldering process may be employed. Further, after sides of the side surface portions 1b, 1c, 1d and 1e and top surface portion 1f of the shielding plate blank 1 have been bent, the mutual contacting edges may be bonded by soldering, welding or the like. In addition, the printed wiring board 5 may be bonded by an adhesive to the bottom surface portion 1a of the shielding plate blank 1.

A second embodiment of the present invention will be described with reference to FIGS. 3A to 11 hereinafter. The same and similar portions of FIG. 3A to 18 as those of FIGS. 2A to 2E have the same reference numerals. In FIGS. 3A to 5B, 7 and 8, 1 denotes a shielding plate blank provided by eliminating unnecessary parts of a thin metal strip by means of cutting, pressing, etching etc. and bending predetermined portions of the processed metal strip. The shielding plate blank 1 comprises a bottom surface portion 1a to constitute the bottom surface of a box-shaped shielding case, side surface portions 1b, 1c, 1d and 1e to constitute the respective side surfaces of the shielding case, and a plurality of leads 1g adjoining a tie bar 2. Each of interface portions between the bottom surface portion 1a and respective side surface portions 1b and 1d and between the top portion 1f and respective side portions 1c and 1e has a slit 3 formed in those portions.

Figure 3A:
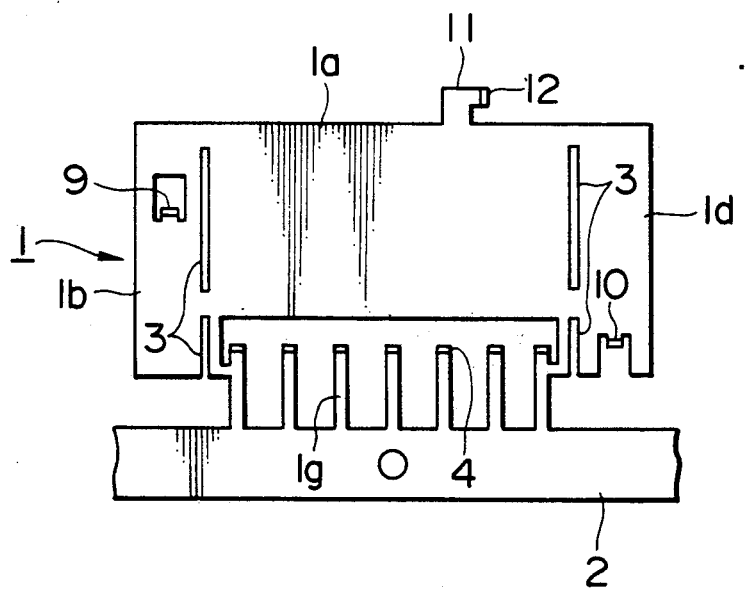
FIGS. 3A to 5B illustrate a process for producing high-density circuit module according to a second embodiment of the present invention.
Figure 3B:
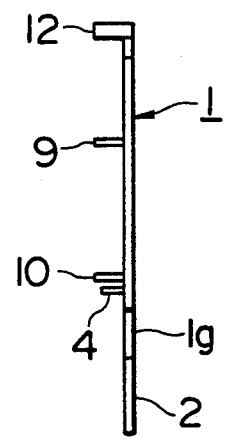
Figure 4A:
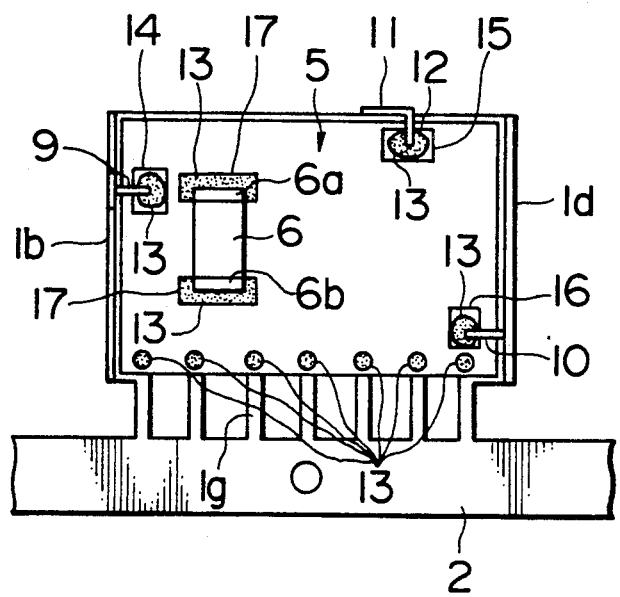
Figure 4B:
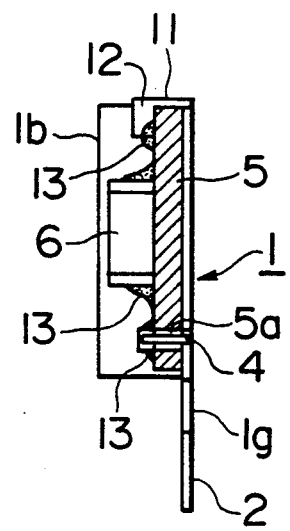
Figure 5A:
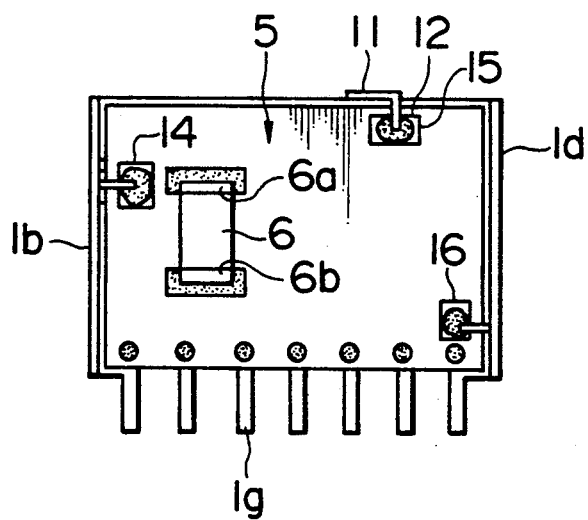
Figure 5B:
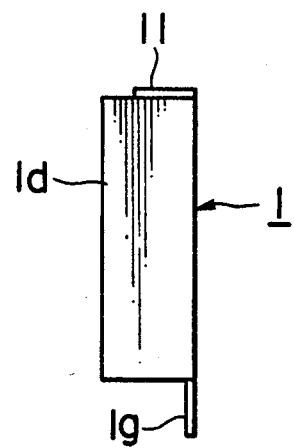
Figure 13:
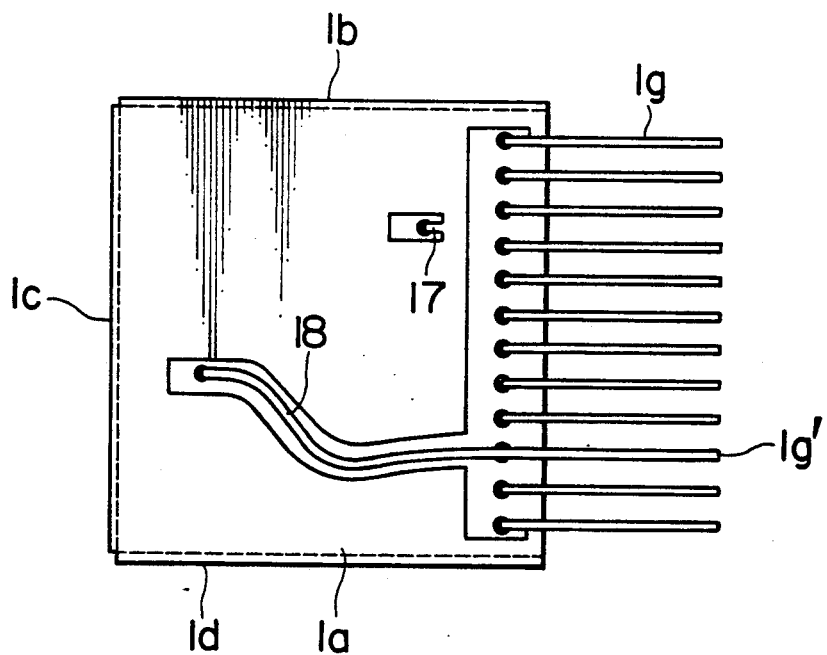
FIG. 13 a bottom view of the high-density circuit module of FIG. 12.

Reference numeral 9 denotes a raised portion of the side surface portion 1b formed by cutting out and raising one end of the side portion 10 denotes a raised portion formed by cutting out and raising a part of one end of the side surface portion 1d, and 11 denotes an L-shaped extension formed integrally with one side of the bottom surface portion 1a. The front end of the L-shaped extension 11 is bent substantially at a right angle to provide a raised end 12. 4 denotes a raised portion formed by bending one end of each of the leads 1g. As best shown in FIG. 3B, the raised ends 4, 9, 10 and 12 extend from the shielding plate blank 1 in the same direction. The shielding plate blank 1 is made with a thin plate of a metal, e.g., steel or a copper alloy or made of a plated thin metal plate derived therefrom. The tie bar 2 has a large number of the same shielding plates attached thereto by means of the external leads 1g as the shielding plate blank 1 of FIG. 3A. A printed wiring board 5 is placed on the bottom surface portion 1a of the shielding plate blank 1 of FIGS. 3A and 3B. The printed wiring plate 5 is provided with small holes 5a through which the raised ends 4 of the external leads 1g pass, grounding lands 14, 15 and 16, a land 17 to be connected to an electronic component, etc. As shown in FIGS. 4A and 4B, the interface portions between the bottom surface portion 1a and side surface portion 1b and between the bottom surface portion 1a and side surface portion 1d are bent and the interface portion between the bottom portion 1a and the extension 11 is bent after the printed wiring board 5 is placed on the bottom portion 1a of the shielding plate blank 1 so that the raised ends 4 of the leads 1g pass through the small holes 5A. When the side surface portions 1b and 1d and the extension 11 are so bent, the respective raised ends 9 and 10 of the side surface portions 1b and 1d are in contact with the grounding lands 14 and 16 of the printed wiring board 5 and the raised end 12 of the extension 11 is in contact with the grounding land 15 of the printed wiring board 5. Then, an electronic component 6 and other electronic components are placed on predetermined positions of the printed wiring board 5, and a soldering paste is applied to all positions to be soldered. Then the soldering paste is reflow-heated to melt in order to perform a soldering. As shown in FIGS. 4A and 4B, the raised end 9 and grounding land 14 are soldered, and the raised end 10 and grounding land 16 are soldered. The raised end 12 and grounding land 15 are soldered, and each of the raised ends 4 of the leads 1g and an externally connected land of the printed wiring board 5 are soldered. The electronic component 6 and other electronic components and the lands of the printed wiring board 5 to be connected to the electronic components are soldered. In FIGS. 4A and 4B, 13 denotes soldered places. As shown in FIGS. 5A and 5B, after the soldering of FIGS. 4A and 4B are completed, the tie bar 2 is separated from the external leads 1g to complete a high-density circuit module of the second embodiment. As shown in FIGS. 5A and 5B, the top surface portion of the shielding case of the complete high-density circuit module of the second embodiment is open since the shielding plate blank 1 lacks the top surface portion. In order to increase the function of the shielding case, a cover made of a metal plate may cover the open top ends of the shielding case. FIGS. 3A to 5B illustrate the single circuit component 6 of a plurality of circuit components mounted on the printed wiring board 5.

Figure 6:
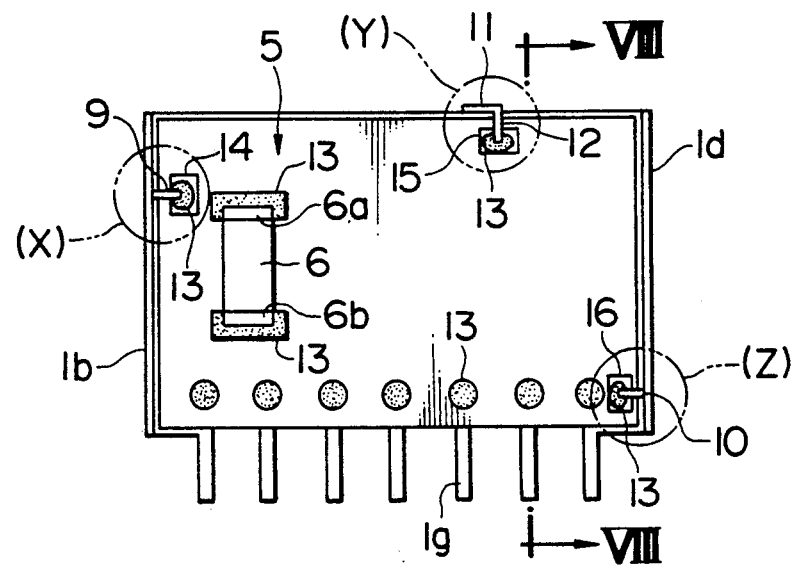
FIG. 6 is a plan view of a complete high-density circuit module of the second embodiment.
Figure 7:
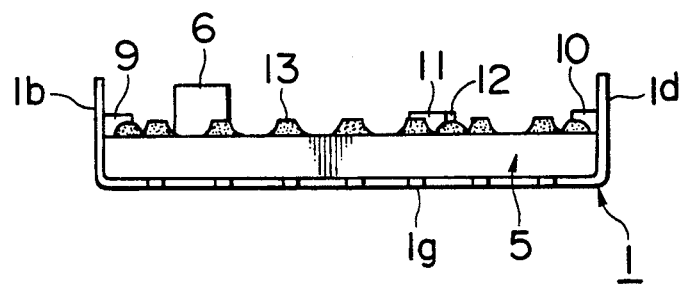
FIG. 7 is a front view of the high-density circuit module of FIG. 6.
Figure 8:
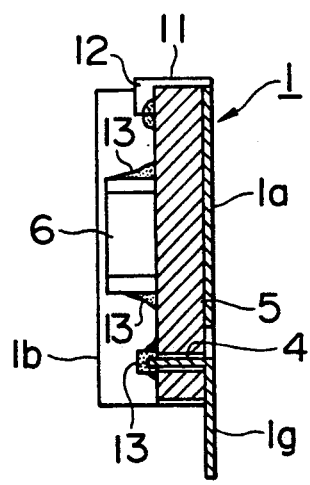
FIG. 8 is a section taken along VIII—VIII line in FIG. 6.
Figure 9:
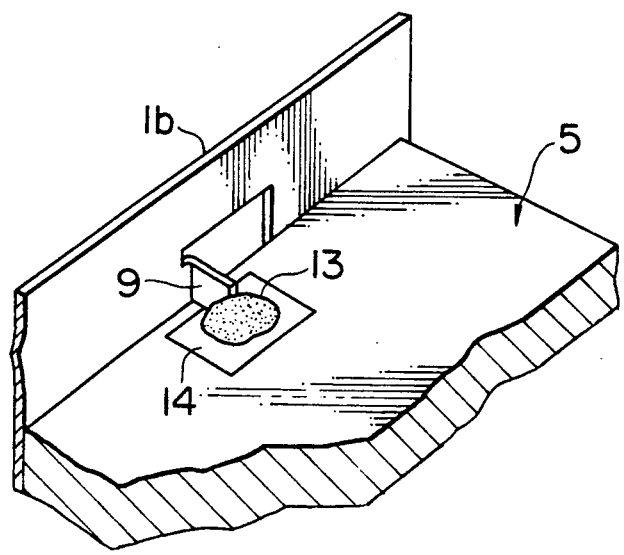
FIGS. 9 to 11 are perspective views of main parts of the high-density circuit module of the second embodiment.
Figure 10:
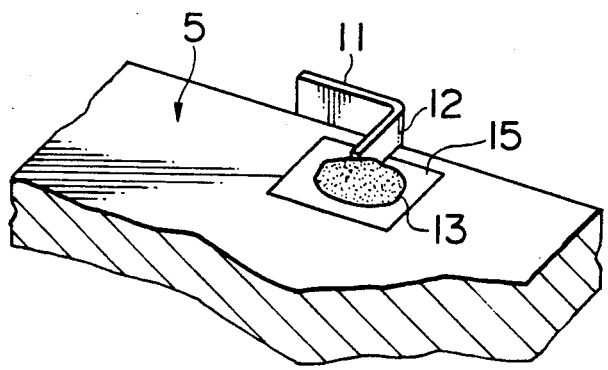
Figure 11:
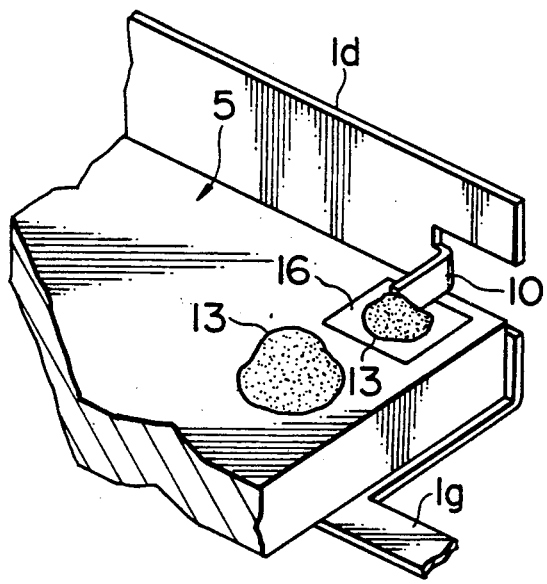

FIGS. 6 to 8 illustrate the completed high-density circuit module of the second embodiment. FIGS. 9 to 11 illustrate respective encircled portions X, Y and Z of FIG. 6, that is, the places where the respective raised ends 9, 12 and 10 are soldered to the grounding lands 14, 15 and 16 of the printed wiring board 5.

The second embodiment of FIGS. 3A to 11 has the following peculiar advantages:

(1) Since the respective raised ends 9, 12 and 10 of the shielding plate blank 1 are soldered to the grounding lands 14, 15 and 16 of the printed wiring board 5 and concurrently, the electronic components are soldered to the printed writing board 5, a need for a working dedicated to the grounding of the high-density circuit module is eliminated. In addition, since parts of the shielding plate blank 1 constitute the respective raised ends 9, 12, and 10, a need for components dedicated to the grounding of the high-density circuit module is eliminated.

(2) Since the printed wiring board 5 has the grounding lands 14, 15 and 16 at optional places thereof, a need for a grounding path of the printed wiring board 5 is eliminated and the density of mounting electronic components on the printed wiring board 5 is increased. In addition, since a required place of the printed wiring board 5 optionally has a grounding point, the high-density circuit module secures its grounding.

(3) Since the raised ends 9, 12 and 10 of the shielding plate blank 1 is soldered to the printed wiring board 5, it serves to press the printed wiring board 5 on the bottom surface portion 1a of the shielding plate blank 1 by means of the raised ends 9, 12 and 10. In addition, since the number of soldered positions between the shielding plate blank 1 and printed wiring board 5 is increased, the mechanical strength of the high-density circuit module is increased.

Figure 12:
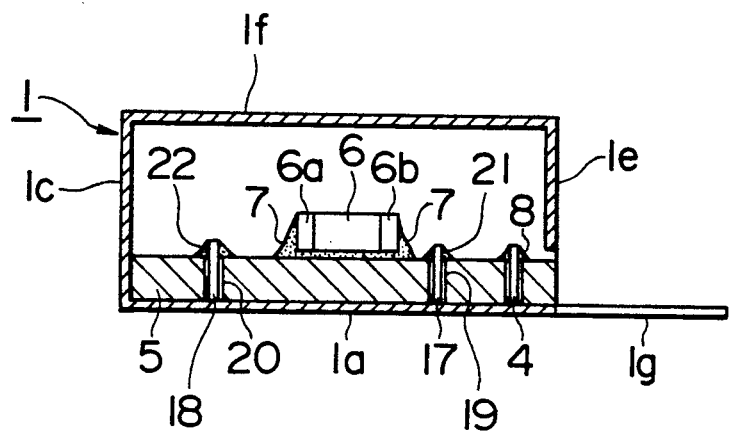
FIG. 12 is a side elevation section through a high-density circuit module according to a third embodiment of the present invention.

FIGS. 12 and 13 illustrate a third embodiment of the present invention. In FIGS. 12 and 13, a part is cut out of a bottom surface portion 1a of a shielding plate blank 1 and raised to provide a raised piece 17 the front end of which is bent essentially at right angle. 18 denotes a jumper lead formed by extending one end of an external lead 1g' up to the bottom surface portion 1a. The front end of the jumper lead 18 is bent substantially at a right angle. When a printed wiring board 5 is placed on the bottom surface portion 1a of the shielding plate blank 1 having the raised piece 17 and jumper lead 18 thus formed, the raised piece 17 passes through a small hole 19 defined in the printed wiring board 5 and the raised front end of the jumper lead 18 passes through a small hole 20 defined in the printed wiring board 5. The printed wiring board 5 is placed on the bottom surface portion 1a of the shielding plate blank 1. Then, a creamy solder is applied to appropriate places of the top surface of the printed wiring board 5. Then, an electronic component 6, for example, is mounted to the printed wiring board 5. Then, the creamy solder is molten by heating to bond connection terminals 6a and 6b of the electronic component 6 to a topside conductor pattern of the printed wiring board 5 by means of a soldering and the raised ends 4 of the external leads 1g are connected to connection lands of the printed wiring board 5 by means of a soldering 8. The raised piece 17 is connected to a grounding land of the printed wiring board 5 by means of a soldering 21, and the front end of the jumper lead 18 is connected to a connection land of the printed wiring board 5 by mean of a soldering 22.

In accordance with the third embodiment of FIGS. 12 and 13, the raised piece 17 of the bottom portion 1a of the shielding plate blank 1 is soldered to the grounding land of the topside conductor pattern of the printed wiring board 5 to easily ground a central portion of the printed wiring board 5, so that a need for fretting a grounding path extending along the topside conductor pattern of the printed wiring board 5 is eliminated. In addition, since the connection land provided at the center of the top surface of the printed wiring board 5 is soldered to the front end of the jumper lead 18 to electrically connect the connection land delineated at the center of the top surface of the printed wiring board 5 to the external lead 1g', a need for a conductor pattern connecting a connection point at the center of the top surface of the printed wiring board 5 to one of the external leas 1g' is eliminated, so that an area of the printed wiring board 5 to which the electronic components are mounted and an area containing a signaling path are sufficiently secured and the density of mounting electronic components is increased. In addition, a provision of the raised piece 17 grounds required places of the printed wiring board 5 so a to secure a grounding of the high-density circuit module.

Figure 14:
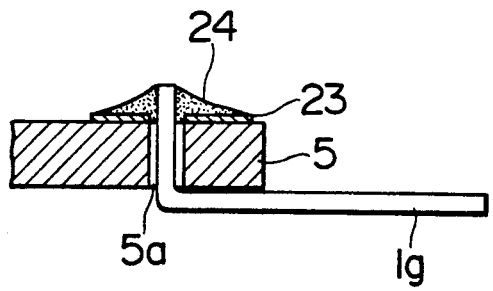
FIG. 14 is a sectional view of a connection of a lead for the high-density circuit module of FIG. 12.

FIG. 14 illustrates a soldered portion between each of the external leads 1g and the topside conductor pattern of the printed wiring board 5 according to the third embodiment of the present invention. FIG. 14 illustrates the case of bending the front end of the external lead 1g, passing the L-shaped front end of each of the external lead 1g through a corresponding small hole 5a in the printed wiring board 5 and bonding the external lead 1g to a connection pattern 23 fretted around the edge of the small hole 5a in the printed wiring board 5 by means of a soldering 24, when the printed wiring board 5 is subjected to a thermal impact stress so that the printed wiring board 5 is thermally expanded in the thickness thereof and so that the external lead 1g is also thermally expanded. Thus, a difference between the thermal expansions of the printed wiring board 5 and external lead 1g subjects the external lead 1g to a tension, so that the soldered joint between the connection pattern 23 and external lead 1g may produce a thermal fatigue failure. When a pitch of the plurality of external leads 1g soldered to the printed wiring board 5 is decreased, it is difficult to secure a sufficient area of each of the connection patterns 23 to which the external lead 1g is soldered, thereby causing a decrease in the quantity of solder and mechanical strength of the soldered joint between the connection pattern 23 and external lead 1g, so that the thermal fatigue failure in this soldered joint is remarkably developed.

Figure 15:
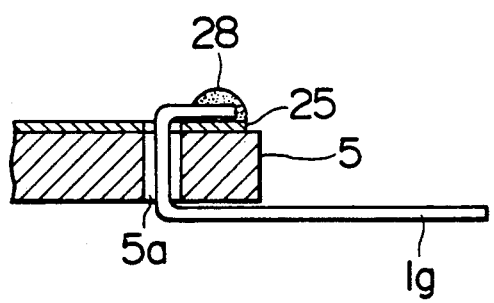
FIG. 15 is a sectional view of a connection of a lead of a high-density circuit module according to a fourth embodiment.
Figure 16:
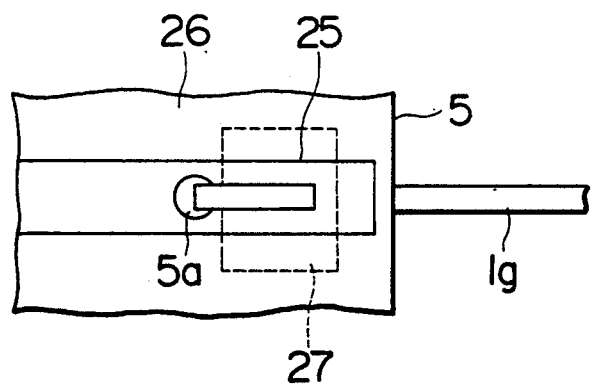
FIG. 16 is a plan view of the connection of the lead of FIG. 15.

A fourth embodiment of the present invention of FIGS. 15 and 16 has a soldered joint with an improved structure in order to prevent the soldered joint from experiencing the above-described thermal fatigue failure. In FIGS. 15 and 16, 5 denotes a printed wiring board and 5a denotes a small hole defined in the printed wiring board. The top surface of the printed wiring board 5 has a conductor pattern 25 delineated thereon, and 26 denotes a resisting film which covers the top surface of the printed wiring board 5 and topside conductor pattern 25 except at an area 27 shown enclosed with broken lines. The printed wiring board 5 is placed on the bottom surface portion 1a of the shielding plate blank 1 to pass the external lead 1g having the L-shaped front end through the small hole 5a defined in the printed wiring board 5. Then, the L-shaped front end of the external lead 1g is further bent in a U-shape. Then, a creamy solder is applied to a joint between a leading branch of the U-shaped of the front end of the external lead 1g and topside conductor pattern 25. Then the creamy solder applied to the joint between the leading branch of the front end of the external lead 1g and topside conductor pattern 25 is heated. Then the creamy solder is heated to melt bond the leading branch of the front end of the external lead 1g by means of a soldering 28 to the topside conductor pattern 25 at the opening 27 in the resisting film 26. Thus, when the U-shaped front end of the external lead 1g is soldered to the topside conductor pattern 25 at a place separate from the small hole 5a, the U-shaped front end of the external lead 1g causes the external lead 1g to be flexed even when a possible thermal impact stress expands the printing wiring board 5 and external lead 1g so that a difference between the thermal expansions of the external lead 1g and printed wiring board 5 develops a tension, so that the soldered joint between the front end of the external lead 1g and topside conductor pattern 25 experiences no direct thermal impact stress, which prevents this soldered joint from an occurrence of a thermal fatigue failure.

Figure 17:
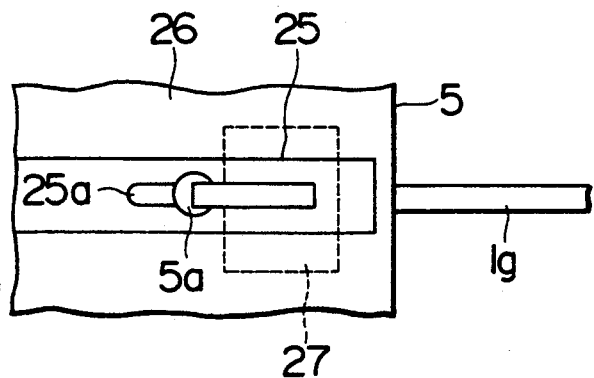
FIG. 17 is a plan view of a connection of a lead of a high-density circuit module according to a fifth embodiment of the present invention.

FIG. 17 illustrates a fifth embodiment of the present invention improving the fourth embodiment A printed wiring board 5 of the fifth embodiment has a slit 25a communicating with the small hole 5a and defined in a portion of a topside conductor pattern 25 fretted around the edge of a small hole 5a by means of eliminating part of the topside conductor pattern 25. Thus, in the case of eliminating a part of the conductor pattern 25 to form the slit 25a, the slit 25a prevents solder invading small hole 5a during soldering from completely filling the small hole 5a.

Figure 18:
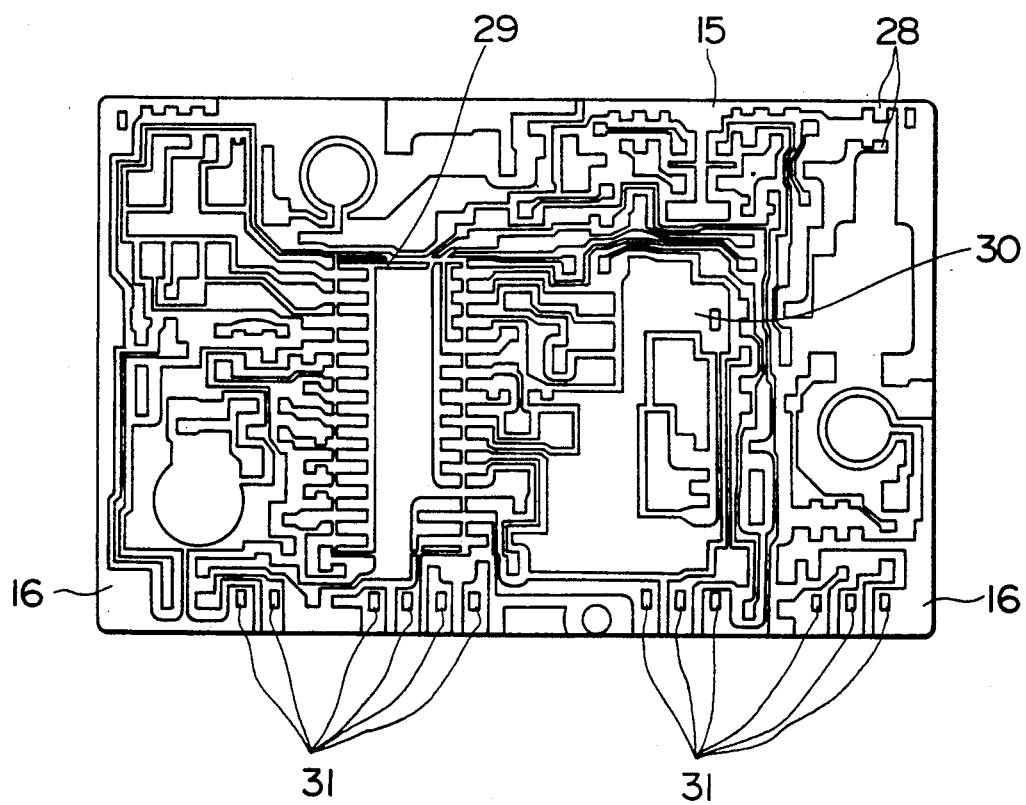
FIG. 18 illustrates one example of a conductor pattern of a printed wiring board of the high-density circuit module of the present invention.

FIG. 18 illustrate one example of a conductor pattern of a printed wiring board of a high-density circuit module designed by the present inventor. The conductor pattern of FIG. 18 comprises a large number of connection lands (e.g., connection lands 28) to which chip components are soldered, a connection land 29 to which a semiconductor device with a large number of terminals is soldered, lands 16 to which raised portions of side portions of a shielding plate blank 1 corresponding to the raised ends 9 and 20 of FIG. 10 are soldered, a land 15 to which a raised end of an L-shaped extension from a side of the bottom portion of the shielding plate blank 1 (e.g., the raised end 12 of the extension 11 of FIG. 3) is soldered, a grounding land 30 to which a raised piece of the bottom portion 1a of the shielding plate blank 1 corresponding to the raised piece 17 of FIG. 13 is soldered, connection lands 31 to which external leads 1g are soldered, and the like.

What is claimed is:

1. A high-density circuit module, comprising:
  a box shaped shielding case including a bottom surface portion, a top surface portion and four side surface portions and formed by bending a metal shielding plate blank including at least said bottom surface portion and at least two of said side surface portions integrally adjoining said bottom surface portion;
  a printed wiring board placed on the bottom surface portion of said shielding case;
  a plurality of electronic components each soldered to a respective conductor land of said printed wiring board; and
  a plurality of leads integrally connected to and disposed substantially in a same plane as one of said surface portions of said shielding case, at least some of said plurality of leads being soldered to a respective connection land of said printed wiring board, said at least some of said plurality of leads being separable from said bottom surface portion to provide a plurality of external connection leads.

2. A high-density circuit module as recited in claim 1, wherein a raised portion formed by bending a part of the shielding plate blank is soldered to a grounding land of said printed wiring board.

3. A high-density circuit module as recited in claim 1, wherein a raised portion formed by bending a part of said side surface portions of the shielding plate blank is soldered to a grounding land of the printed wiring board.

4. A high-density circuit module, comprising:
  a box shaped shielding case including a bottom surface portion, a top surface portion and four side surfce portions and formed by bending a metal shielding plate blank including at least said bottom surface portion and at least two of said side surface portions integrally adjoining said bottom surface portion;
  a printed wiring board placed on the bottom surface portion of said shielding case;
  a plurality of electronic components soldered to a conductor land of said printed wiring board; and
  a plurality of externally connected leads soldered to a connection land of said printed wiring board connected to an disposed substantially in a same plane as one of said surface portions of said shielding case, wherein a raised portion formed by bending a part of the bottom portion of the shielding plate blank passes through a hole in said printed wiring board and the front end of the raised portion is soldered to a grounding land of said printed wiring board.

5. A high-density circuit module as recited in claim 1, wherein at least one of said plurality of leads is integral with the bottom surface portion of the shielding plate blank and is non-separable from said bottom surface portion, said at least one lead being adapted to be applied to a grounding terminal.

6. A high-density circuit module, comprising:
  a box shaped shielding case including a bottom surface portion, a top surface portion and four side surfce portions and formed by bending a metal shielding plate blank including at least said bottom surface portion and at least two of said side surface portions integrally adjoining said bottom surface portion;
  a printed wiring board placed on the bottom surface portion of said shielding case;
  a plurality of electronic components soldered to a conductor land of said printed wiring board; and
  a plurality of externally connected leads soldered to a connection land of said printed wiring board connected to and disposed substantially in a same plane as one of said surface portions of said shielding case, wherein a substantially L-shaped front end of the externally connected leads passes through a small hole in said printed wiring board and is soldered to a connection land of said printed wiring board.

7. A high-density circuit module, comprising:
  a box shaped shielding case including a bottom surface portion, a top surface portion and four side surfce portions and formed by bending a metal shielding plate blank including at least said bottom surface portion and at least two of said side surface portions integrally adjoining said bottom surface portion;
  a printed wiring board placed on the bottom surface portion of said shielding case;
  a plurality of electronic components soldered to a conductor land of said printed wiring board; and
  a plurality of externally connected leads soldered to a connection land of said printed wiring board connected to and disposed substantially in a same plane as one of said surface portions of said shielding case, wherein a substantially L-shaped front end of the externally connected leads which has passed through a small hole in said printed wiring board is further bend essentially in a U-shape and a leading branch of the resulting U-shaped front end is soldered to a connection land of said printed wiring board.

8. A high-density circuit module as recited in claim 1, wherein a slit is formed in each of the joints between at least said bottom surface portion and two side surface portions of the shielding plate blank in a boxshaped case including the bottom surface portions, the top surface portion and four side surface portions, and said shielding case is provided by bending the joints having the slits.

9. A high-density circuit module as recited in claim 1, wherein the shielding plate blank further includes a top surface portion and two side surface portions and said bottom surface portion, said top portion and four side surface portions of the shielding plate blank being integrally adjoined to provide said shielding case.

* * * * *